United States Patent [19]
LeBlanc, III et al.

[11] Patent Number: 5,709,785
[45] Date of Patent: Jan. 20, 1998

[54] METALLIZING MACHINE

[75] Inventors: Arthur R. LeBlanc, III, Kennebunk; Donald W. MacMillan, Saco; Donald G. Parent, Windham; Scott R. Parent, Saco; Brian C. Rossignol, South Portland, all of Me.

[73] Assignee: First Light Technology Inc., Saco, Me.

[21] Appl. No.: 658,170

[22] Filed: Jun. 4, 1996

Related U.S. Application Data

[60] Provisional application No. 60/000,088, Jun. 8, 1995.
[51] Int. Cl.⁶ .................... C23C 14/50; C23C 14/56; C23C 16/00
[52] U.S. Cl. ............... 204/298.25; 204/298.15; 204/298.23; 204/298.26; 204/298.27; 204/298.28; 204/298.29; 118/719; 118/728; 118/729; 118/730; 118/503
[58] Field of Search ............... 204/298.15, 298.23, 204/298.25, 298.26, 298.27, 298.28, 298.29, 298.11; 118/719, 728, 729, 730, 500, 503

[56] References Cited

U.S. PATENT DOCUMENTS

| | | | |
|---|---|---|---|
| 4,675,096 | 6/1987 | Tateishi et al. | 204/298.25 |
| 4,735,540 | 4/1988 | Allen et al. | 118/503 |
| 4,915,564 | 4/1990 | Eror et al. | 204/298.25 |
| 4,943,363 | 7/1990 | Zejda et al. | 204/298.15 |

*Primary Examiner*—R. Bruce Breneman
*Assistant Examiner*—Rodney G. McDonald

[57] ABSTRACT

A vacuum-metallizing machine including a metal platter base (17) having an obverse side and a face side. A substrate-receiving platter (2) is resiliently disposed (3, 3b) in a recess on the face side of the platter base (17). The platter (2) receives a substrate to be metallized. A circumferentially-arranged rigid ring (27) of predetermined dimensions and location is disposed on the face side and mates with a ring (29) around a port (11) on the wall of the vacuum chamber which surrounds an opening in the wall. Engagement of these rings aligns the platter base (17) relative to the port (11, 12, 13 and 14). A compliant ring (42) is disposed between the wall and the platter base (17). The obverse side of the platter base (17) and the chamber are resiliently forced (37a, 37b, 37c) into contact with each other with a toggling action (24, 22b, 22) whereby to align the platter base (17) relative to the port, to force the outer diameter of the platter base (17) into metal-to-metal contact with the periphery of the port (11), to align the substrate relative to the port (11) and also to force the compliant ring into sealing engagement with the wall, thus, to form a vacuum tight seal.

15 Claims, 5 Drawing Sheets

METALLIZING MACHINE

This application claims the benefit of U.S. Provisional application Ser. No.: 60/000,088 FILING DATE Jun. 8, 1995.

FIELD OF THE INVENTION

The present invention relates to vacuum metallizing equipment to coat thin layers of metal on substrates and particularly for automated vacuum metallizing equipment for the manufacture of compact discs.

DESCRIPTION OF THE PRIOR ART

Machines for applying metal coatings to various substrates, especially compact discs, are well known to the art. Such machines have included an isolation chamber held at a vacuum, a sputtering chamber also held at a vacuum, a mechanism to apply a metallic surface to a substrate under a vacuum, and a means to transport the substrate back to the atmosphere from the chamber. Prior art devices for metallizing substrates often use linear translating seals to maintain a vacuum. Such seals are frequently unreliable and necessitate frequent maintenance.

SUMMARY OF THE INVENTION

According to the present invention we have discovered a highly reliable and low maintenance vacuum metallizing machine for use in placing thin coatings of metal on substrates, especially for the manufacture of compact discs. The machine includes at least two, four, or even more, platters which are arranged to rotate between an equal number of stations. At one station a substrate is loaded on a platter by taking it from a loading robot at atmospheric pressure. It is then transported through a port in the wall into a vacuum chamber. While on the platter, the substrate is transferred through another port into a metallizing station containing a conventional sputtering cathode for a metallized coating. The coated substrate is transported to the loading robot where it is unloaded through the first port from the vacuum chamber and an uncoated substrate inserted in its place.

According to the present invention, the machine includes a vacuum chamber with at least one loading-unloading port with a load-lock mechanism and at least one sputtering station port. A platter is disposed on the face side of the platter base. The platters are supported on the platter bases so they can move slightly in all directions whereby to adjust for tolerance and temperature variations of components in the equipment. At least two reciprocating and oscillating platter bases are disposed on a rotatable carrier within the chamber. A circumferentially-arranged rigid ring of predetermined dimensions is disposed on the face side of the platter and another rigid ring forming a sealing face of predetermined dimensions is disposed around ports on the walls of the chamber. One of the rings is formed as a protuberance and the other is formed as a recess thereby enabling the two rings to engage each other and for one to enter the other to a predetermined extent. When the ring on the platter engages the sealing face on the wall, the platter is aligned relative to the port in the wall. Small variations in centering and lengths of the various components due to tolerance variations of the machine are compensated for by the centering and alignment of these two rings. While mating rings are preferred for such alignment, it is manifest that other constructions can be utilized such as at least three centering points with corresponding cavities which will also align the platter relative to the opening.

A resilient ring in the form of an O-ring is disposed between the face side of the platter and the vacuum chamber wall. Preferably, the O-ring is disposed in a cavity encircling each port. Its unengaged thickness must be greater than the distance between the platter base and the port in the wall so when they engage, the O-ring will help in the formation of a vacuum seal between the station and the chamber.

The platter base reciprocates from a position where it engages the sealing face around the port in the vacuum chamber wall to disengagement by a toggle arrangement and an articulated shaft which is resiliently connected to the obverse side of the platter base. Preferably, springs in the form of an array of concentric, resilient O-rings are disposed between the platter base and the shaft. The shaft is urged against the resilient rings which in turn urge the face side of the platter against the rigid rings to center the platter relative to the ports in the vacuum chamber walls. Since the platter and the platter base are free to move (within limits) in a direction normal to the stroke of the shaft before the rigid rings engage each other, small dimensional deviations in the platter and the ports of the vacuum chamber can be compensated for, thereby enabling the formation of a better vacuum seal. Moreover, wear in the parts and normal expansion and contraction of the parts is compensated for also. After the O-rings around the ports are compressed, the outer diameter of the of the platter base is forced into engagement with the sealing face around the port in a metal-to-metal contact whereby to seal the station from the vacuum chamber.

BRIEF DESCRIPTION OF THE DRAWING

In FIG. 3A the platters which receive substrates are retracted from engagement with the respective ports. In FIG. 3B the platters are shown engaging the ports.

DESCRIPTION OF THE PREFERRED EMBODIMENT

Figure 1:
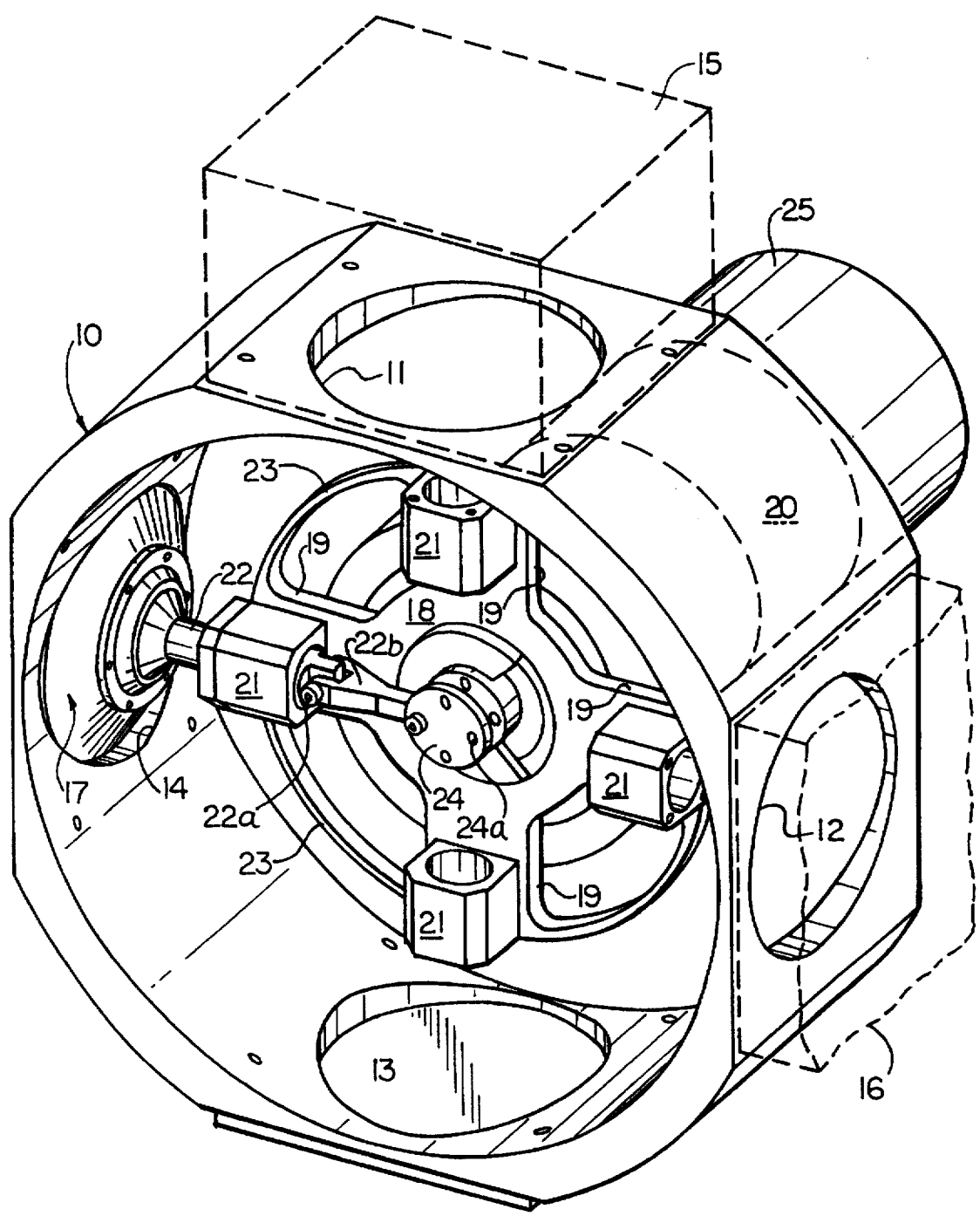
FIG. 1 is a fragmentary perspective elevational view of our vacuum metallizer for applying metal to substrates.

Referring now to FIG. 1, a vacuum chamber 10 is shown having four radially-arranged ports 11, 12, 13 and 14. In this embodiment, port 11 serves as a loading and unloading port for substrates to be metallized. A conventional load-lock system 15 (shown in dotted lines) including a robot is attached to the vacuum chamber 10. A conventional sputtering station 16 (shown in dotted lines) is disposed at port 12 to receive a substrate and coat a metallized surface onto it. Four platter bases 17 are radially arranged within the vacuum chamber 10. Platters (not shown) to hold the substrates are disposed in recesses in each of the platter bases 17. In this view, for simplicity, only one platter base 17 is shown.

A carrier 18 has four radially-extending arms 19 disposed on it. Linear bearings 21 are disposed on each of the arms 19. Each of these bearings 21 receives a push rod 22. A mechanism index motor 20 drives a shaft (not shown) in a clockwise direction thereby driving carrier 18 and arms 19 also in a clockwise direction and carrying with it linear bearings 21 and platter bases 17. Arms 19 are peripherally supported by ring segments 23.

In the embodiment of this Figure, platter base 17 is shown engaging the sealing face around port 14. The other platter bases (not shown) engage the sealing faces around ports 11, 12 and 13. They are not free to index from one port to the next during such engagement. When retracted, however, the platter bases 17 can be indexed from the loading and unloading port 11 to the sputtering station port 12 and each of the intermediary ports 13 and 14.

In the embodiment shown, the load-lock system 15 is disposed at the 0° point. Since port 14 at the 270° point and port 13 at the 180° point have no equipment associated with them in this embodiment, they are covered to enclose the vacuum chamber 10 and sustain the vacuum. Sputtering station 16 is disposed at the 90° point. If desired, however, to increase production on the machine it is possible to place on port 14 another conventional sputtering station (such as represented schematically as 16) and another conventional device for robotically loading and unloading substrates at port 13. In this way substrates can be fed into port 11 and metallized at port 12 and unloaded at port 13. In parallel, a new substrate can be inserted at port 13 and metallized at port 14 and removed at port 11. Thus, two metallizing systems work simultaneously. Each of these metallizing steps can be carried out simultaneously, thereby doubling the production of the machine. The motors selected for moving substrates through the chamber are programmed to index +90° and are electronically controlled to eliminate radial motion of the platters 17 during the index. Such motors are well known in the art.

A push rod 22 reciprocates in each linear bearing 21. It is articulated at joint 22a in a conventional yoke and tongue arrangement. An inner segment 22b is attached to a toggle shaft 24 concentric with and rotationally independent of carrier 18. Toggle shaft 24 is attached through mechanism index motor 20 to a toggle motor 25. Toggle motor 25 indexes −90° to retract inner segment 22b (and thus push rod 22 and platter base 17) and then indexes +90° to seal the platter bases 17 against the sealing faces around the respective ports. Such motors are well known to the art.

To introduce the substrates to be coated into the machine, the load-lock system 15 used is similar to systems used in other substrate metallizers currently in use. A loading robot carries a sealing door along with a substrate in the form of a compact disc blank. When the disc is placed in the load-lock, the door seals the load-lock from the atmosphere. The sealing door and the adjacent platter form a load-lock station which can be evacuated by conventional means (not shown) to a pressure similar to that found in the vacuum chamber 10. After evacuation, the platter base 17 can be retracted and indexed to the next station. Discs are removed from the vacuum chamber by the sealing door through the reverse of the load-lock evacuation process. In this process, air or nitrogen is vented into the load-lock to equalize load-lock pressure to the atmosphere. Once stabilized, the loading robot removes the disc and places the new disc in the load-lock for indexing through the metallizing process.

While FIG. 1 shows only one platter base 17 mounted in linear bearing 21, it is to be understood there is at least one pair of platter bases 17 and usually there are two pairs of platter bases 17 and possibly even more pairs of platter bases. Each of the four platter bases 17 has a push rod 22 disposed in a linear bearing 21. Each push rod 22 is attached to an inner segment 22b which, in turn, is attached to toggle shaft 24. The platter bases 17 are fastened to push rods 22 which translate radially through linear bearings 21.

In the preferred embodiment of our invention we use four platter bases 17 and four linear sliding push rods 22, four inner segments 22b, a center toggle shaft 24 which contains four bearings 24a. The platter base 17 and the push rod 22 are joined together utilizing a compliant spring joint formed with concentric O-rings. These O-rings provide compliance to the platter base 17, push rod 22, linkage 22a and toggle shaft assembly 24. The compliant rings provide a controlled pre-load between the platter base 17 and the sealing faces around ports 11, 12, 13 and 14, and also compensate for tolerance variations from part to part in the assembly by equalizing the forces applied to opposing linkages to the toggle shaft assembly. Toggling provides reduced sensitivity to dimensional variations of parts and to expansion and contraction of these parts because of ambient temperatures. The forces exerted by the platter bases 17 upon the sealing faces around ports remain similar due to the compliant spring joints in spite of tolerance variations in parts. The platter bases 17 are extended by the toggle mechanism until the sealing compliant springs contact the vacuum chamber walls. The contact compresses the springs until the outer diameters of the platter base 17 and the platter make contact with the sealing faces around the ports. When metal-to-metal contact is made between the platter base and the sealing face, further expansion caused by the toggle mechanism 24 compresses the compliant O-rings without moving the platter or the substrate. The platters can extend no further since they are in metal-to-metal contact with the chamber walls. The clamping forces rise instantaneously as mechanism deflection transfers from compression of the sealing O-rings to compression of the compliant O-rings.

Variations in the applied load to the joint do not significantly alter the load on the platter. The load-lock platter experiences a varying applied load since it experiences a substantial force applied by atmosphere and no force when it is under vacuum. Despite the varying external force, the platter base does not separate from its metal-to-metal contact with the chamber wall which assures a constant and known deflection of the sealing O-ring in spite of widely varying applied loads. An approximate constant load on the toggle shaft 24 is maintained in spite of the varying load. The torque on the toggle motor 25 is dependent on the angular position of the toggle shaft 24.

Figure 2A:
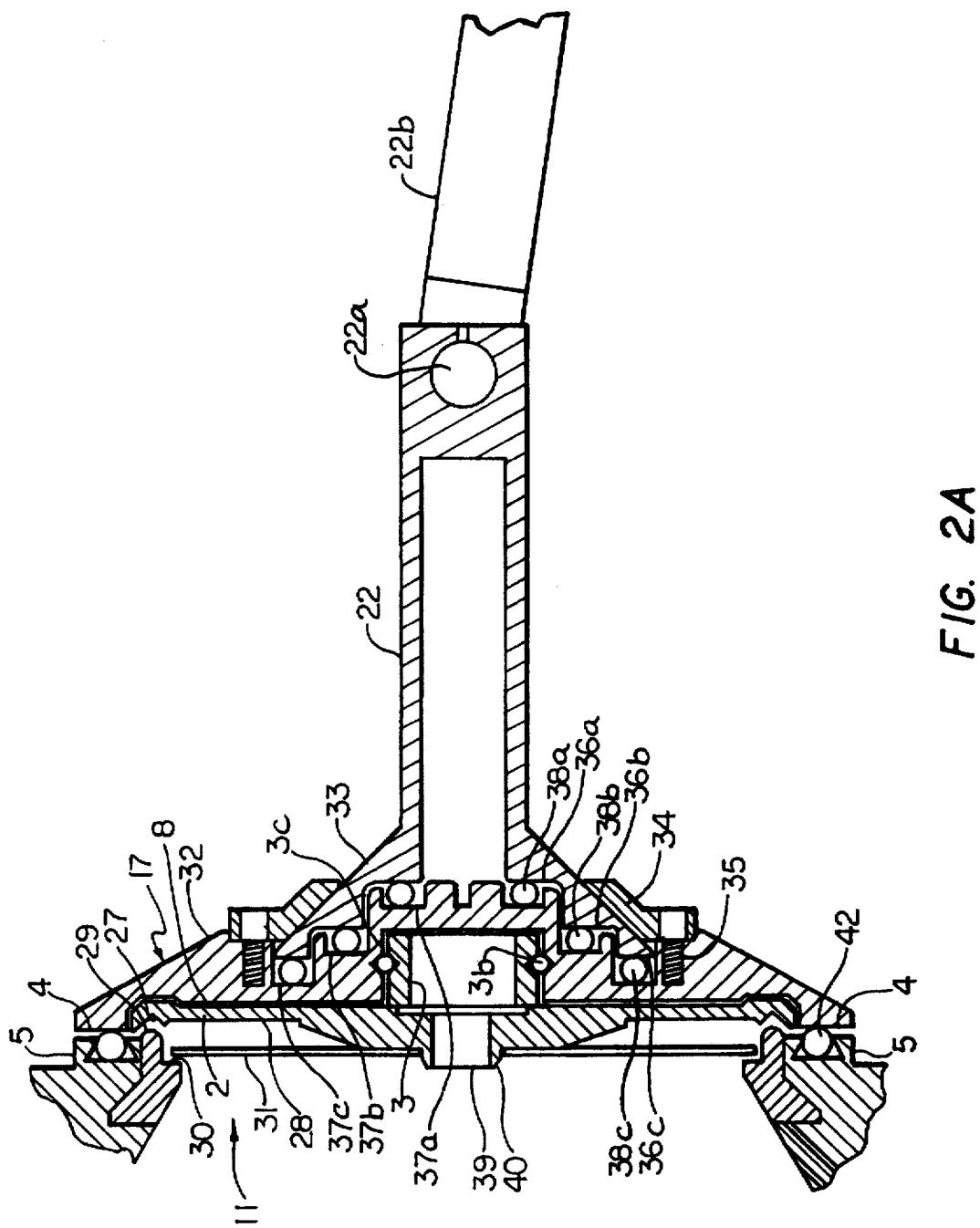
FIGS. 2A and 2B are cross-sectional elevational views of a platter and related components which receive the substrates together with an articulated shaft which forces the platter into engagement with the sealing faces around the ports in the wall of the vacuum chamber and provides for alignment and the formation of a vacuum.
Figure 2B:
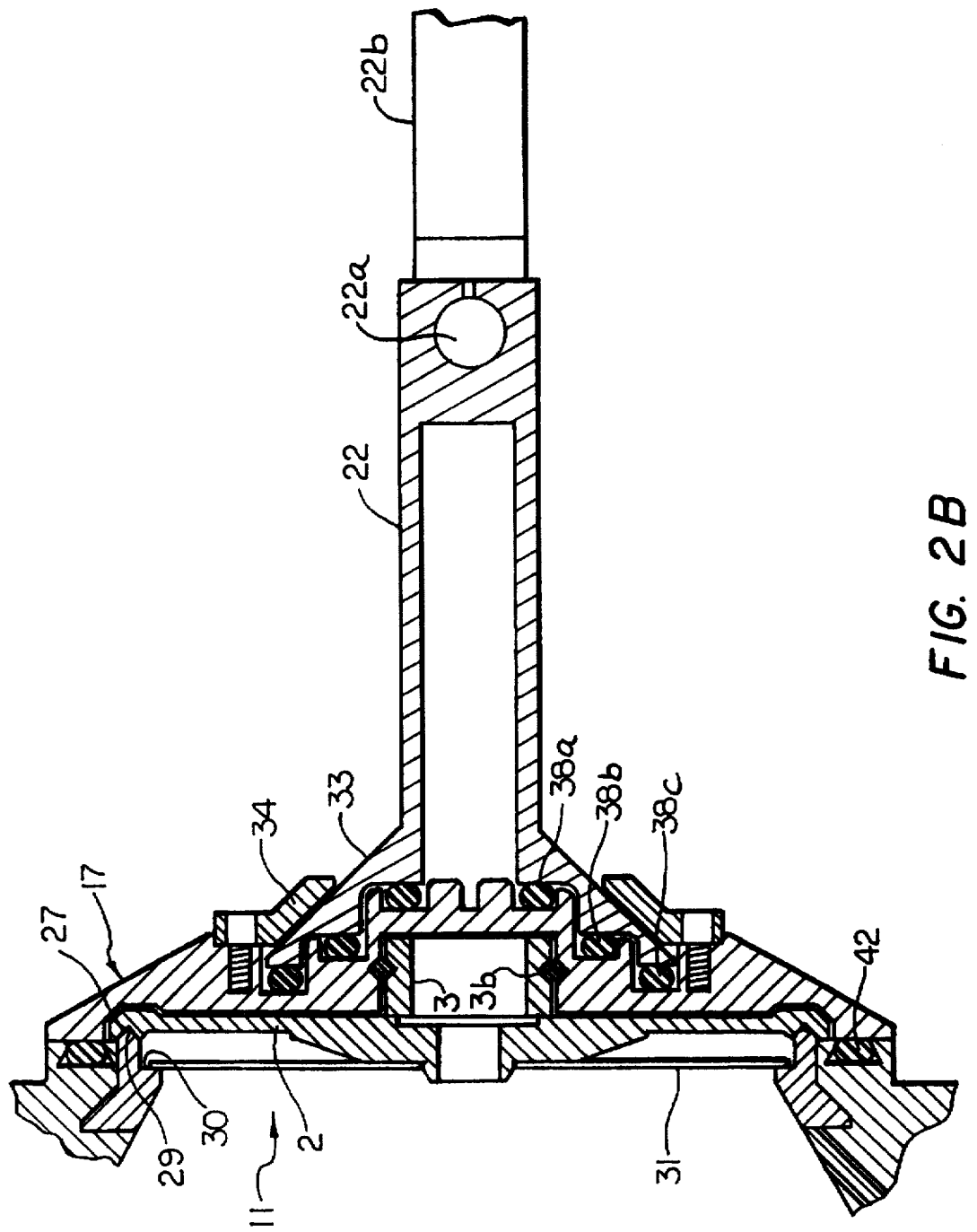

Referring now to FIGS. 2A and 2B, the platter base and platter are shown in two compression modes. In FIG. 2A a platter 2 has a metal ring 27 in the form of a circular groove formed on its face side 28. The ring 27 mates with a ring 29 around the port 11 (for example). The port 11 has a lip 30 disposed on it to receive a substrate 31 in the form of a compact disc carried by the platter 2. The push rod 22 engages the obverse side 32 of the platter base 17. The push rod 22 terminates in a hollow, conically-shaped collar 33 which is free to move (within limits) on the axis of the platter base 17. The collar 33 is attached to the obverse side 32 of the platter base 17 by a ring 34 which engages part of the face of the obverse side 32. Ring 34 is held in place on the obverse side 32 by means of threaded fasteners 35 which tighten ring 34 but enable it to move on its axis. In the inside of collar 33 are a series of coaxially-arranged steps 36a, 36b and 36c. On the inside of the obverse side 32 of platter base 17 are a series of concentric grooves 37a, 37b and 37c. Disposed within the grooves are springs, preferably in the form of O-rings 38a, 38b and 38c. These O-rings space the steps 36a, 36b and 36c from the top of the grooves 37a, 37b and 37c. They also enable the collar 33 to move on its axis slightly. Platter 2 is carried in a recess 8 in the face side of the platter base 17 by a collar 3 which fits into a cavity 3c.

An O-ring 3b holds collar 3 (and, thus, the platter 2) in place in the platter base 17, but allows it to move and shift to compensate for dimensional variations of the components of the machine. When ring 29 enters groove 27 platter 17 will adjust to compensate for variations in tolerance and expansion and contraction. Substrate 31 is held in place by a conventional gripper 39 with fingers 40 that are carried on platter 2.

Movement of the platter base 17 is controlled by push rod 22 and its related toggling action. Push rod 22 has an inner segment 22b which can be disposed at an angle relative to push rod 22. Push rod 22 is articulated at joint 22a to enable push rod 22 (and, thus, the platter base) to move axially while inner segment 22b moves tangentially to provide the toggling action.

As can be seen in FIG. 2B, inner segment 22b is axially aligned with push rod 22. Such alignment forces rings 27 and 29 together to align the platter 2 and, thus, align the substrate 31. The outer diameter 4 of the face side of the platter base 17 engages the chamber wall 5 with metal-to-metal contact and squeezes O-ring 42 therebetween. O-ring 42 has been compressed by platter base 17, and together with the metal-to-metal seal creates a vacuum-tight seal so that loading and unloading of substrate 31 can be provided or vacuum metallizing can be provided within the vacuum metallizer. As can also be seen, O-rings 38a, 38b and 38c are compressed to compensate for variations due to tolerances, expansion and contraction, etc. Since collar 33 is free to move (within limits) within ring 34, the minor variations are compensated for with this relationship between the parts.

Figure 3A:
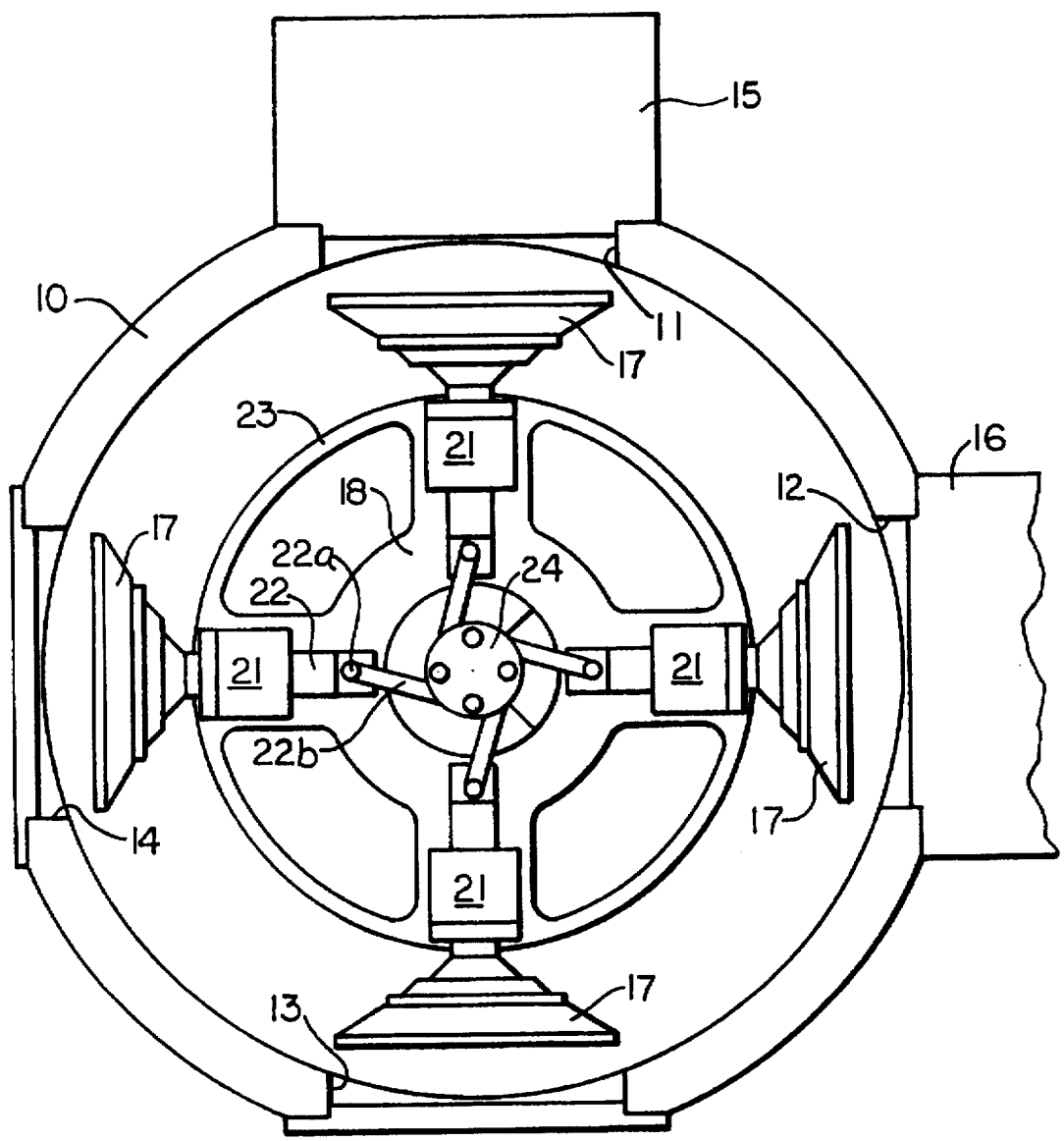
FIGS. 3A and 3B are side elevational views of the vacuum metallizer shown in FIG. 1.
Figure 3B:
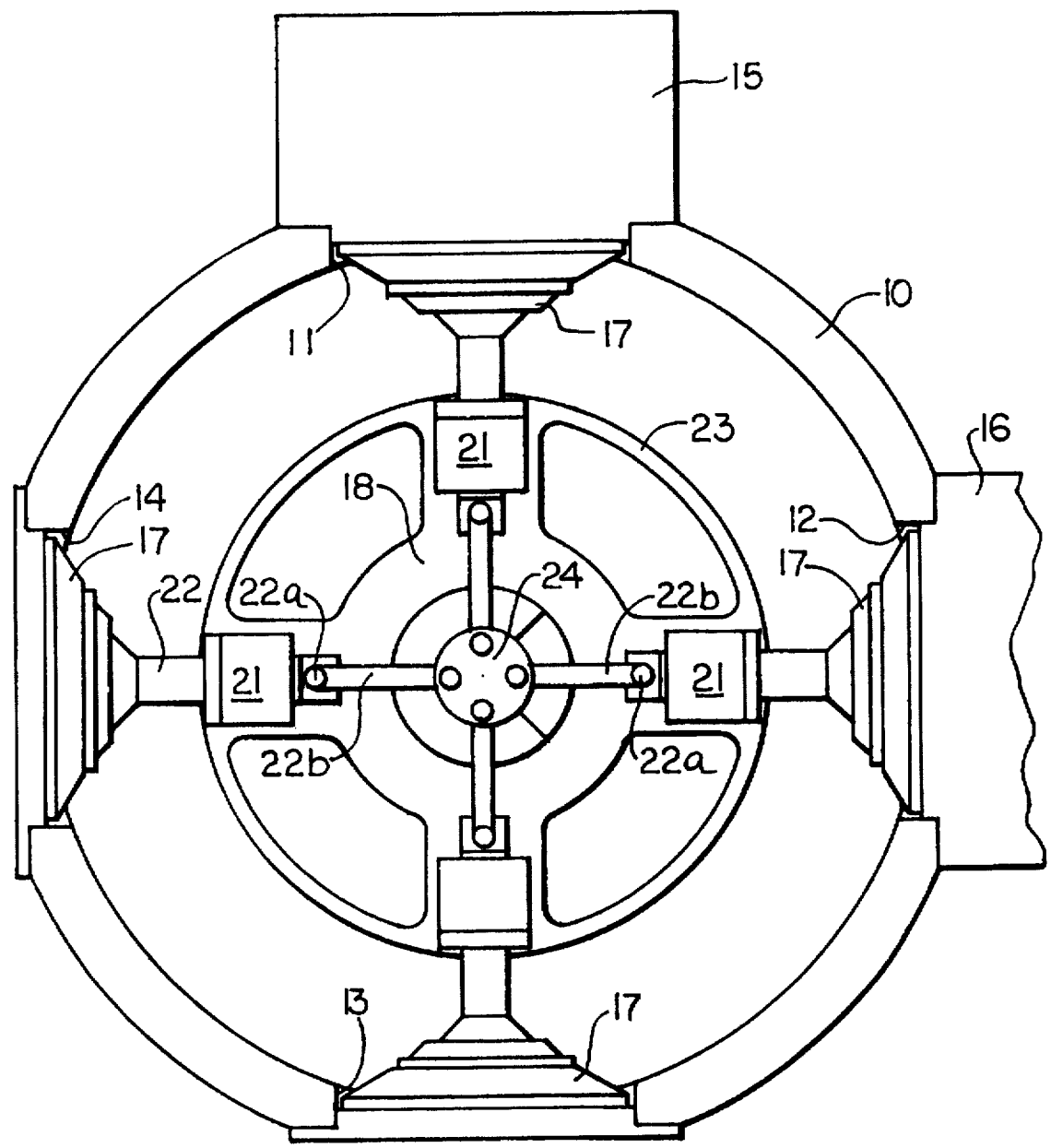

Referring now to FIGS. 3A and 3B, an elevational view of the machine at two stages of operation are shown. In FIG. 3B the platter bases are withdrawn towards the axis of the toggle shaft 24 for indexing from one port to the next. In FIG. 3B the platter bases are disposed adjacent the ports for a mechanical operation. In this embodiment, four platter bases 17 are supported on a carrier 18 by means of linear bearings 21. The linear bearings 21 are attached to carrier 18 and receive push rod 22. Carrier 18 is supported at its periphery by ring segments 23 which connect the arms of the carrier together. Carrier 18 may be turned within vacuum chamber 10 by means of a mechanism index motor (not shown in this view). This index motor can turn carrier 18 in a counterclockwise direction so that the platter bases 17 can be indexed from one port to the other. Push rod 22 is connected to a toggle shaft 24 by means of an inner segment 22b. Toggle shaft 24 is connected to a toggle motor (not shown is this view) and can move in two directions, both counterclockwise and clockwise. When turned in a counterclockwise direction, inner segment 22b will draw push rod 22 inward within linear bearing 21 and turn platter bases 17 and withdraw them from the ports. All four of the platters are withdrawn simultaneously by the rotation of toggle shaft 24 in a counterclockwise direction.

When the platters are indexed in front of the next port, toggle shaft 24 will be rotated clockwise. When the toggle shaft 24 is rotated in a clockwise direction, inner segment 22b will cause push rod 22 to slide within linear bearing 21 which will cause platter base 17 and platter 2 to engage the respective port. This second stage of operation is shown in FIG. 3B, as will be explained hereinafter.

In operation of the equipment, the substrates in the form of compact disc blanks are delivered to the vacuum chamber 10 by means of a load-lock system which is well known to the art. The load-lock system includes a loading robot which carries a sealing door along with a disc. When the disc is placed in the load-lock, a sealing door isolates the load-lock from the atmosphere. The sealing door and the adjacent platter form a load-lock station which can be evacuated to a pressure similar to that found in the vacuum chamber. Once this occurs the platter can be retracted and rotated. A substrate which has been metallized in sputtering station 16 is removed from the vacuum chamber 10 through the reverse of the load-lock evacuation process. In this process air or nitrogen is vented into the load-lock to equalize the load-lock pressure to the atmosphere. Once this occurs the loading robot removes the metallized substrate and places a new substrate in the load-lock.

Substrates are transported from the load-lock to the sputtering station 16 by retracting the platter base 17, indexing the mechanism to the next position and extending platters to their new position. The retraction, rotation and expansion process transports discs around the periphery of the vacuum chamber 10. The platter assembly rotates 90° with each retraction, rotation and expansion cycle. Each cycle produces a metallized disc as each platter sequentially rotates from the sputtering station 16. In the embodiment illustrated, only one load-lock mechanism 15 and one sputtering station 16 is shown, respectively, at ports 11 and 12. If desired, another load-lock mechanism can be placed at port 13 and another sputtering station placed at port 14. In this latter parallel process double production can be realized. On the other hand, if a plurality of sputtering stations are placed in the ports it is possible to layer metallized material on a substrate instead of having all of the metallizing occur in one sputtering station. When the platter bases 17 are extended by the toggle motor 25, the sealing O-rings (shown in FIG. 2) compress until the platter bases make metal-to-metal contact with the walls. At that point further expansion caused by the toggle mechanism compresses the compliant O-rings without moving the platter bases 17, since the platter bases can no longer move because they are in metal-to-metal contact with the chamber wall. The compliant O-rings apply a force to the platter which exceeds the force supplied by atmosphere on the load-lock platter.

The control of pre-load force functions similar to a pre-loaded bolted joint. The load-lock platter experiences a varying applied load since it experiences a similar force applied by the atmosphere and no force when under vacuum. In spite of the varying external force, the platter does not separate from its metal-to-metal contact with the chamber wall. This assures a constant and known deflection of the sealing O-ring in spite of widely varying applied load. It also maintains an approximately constant load on the toggle mechanism in spite of the varying load.

In the metallizer station 16 a thin coating of metal is applied to a substrate. With optical discs, this coating is typically either aluminum or gold. The sputtering cathode contains a sacrificial target which is the source of the deposited material. Atoms from the target are ejected by electrons produced by a plasma. These atoms are ejected in a ballistic manner such that they move in a line of sight from the target and deposit themselves on the first object they strike. In the case of the metallizer used with the transfer mechanism of the present invention, target atoms are deposited on the optical disc and on adjacent shields and masks which make up the sputtering station. The sputtering process takes approximately two seconds or less. Thicker layers require longer sputtering times and thinner layers require less time. With the mechanism of the present invention it is possible to provide a dual cathode which permits a net reduction of sputtering time for the same layer thickness since one cathode deposits half of the layer and the other deposits the remainder. The dual cathode option also permits the deposition of two different materials on discs. In one sputtering station one target material will be used and in another a different target material can be used. Thus, layers of two different materials can be deposited on a given disc. Many variations of disc metallizing can be provided with the construction of the present invention.

While it is apparent that changes and modifications can be made within the spirit and scope of the present invention, it is our intention, however, only to be limited by the appended claims.

As our invention we claim:

1. A device for vacuum metallizing a substrate in a station disposed on a wall of a vacuum chamber, said device comprising:

a rigid platter base having an obverse side and a face side, said face side having a recess therein adapted to receive a platter, said platter having a longitudinally-extending face side and an obverse side, said face side of said platter providing a substrate-receiving surface adapted to receive a substrate to be metallized, the obverse side of said platter being attached to and resiliently disposed in said recess, said platter and said platter base each being independently movable relative to said wall to provide for positional adjustments of said platter base and said platter relative to said wall;

means for the perimeter of said platter base to engage said wall to align said face side of said platter base and platter relative to a location on said wall;

means to resiliently engage said obverse side of each of said platter base and said platter whereby to force rigid engagement of the face side of said platter base into contact with said wall whereby to provide independent alignment of said platter base and said platter and also to provide face-to-face vacuum sealing with said wall.

2. The device according to claim 1 wherein said substrate is a compact disc and further including means for the perimeter of said compact disc to engage said wall.

3. The device according to claim 2 further including a resilient engagement means being disposed between said platter and said wall, said resilient engagement means encompassing said substrate to aid in forming a sealed zone between said vacuum chamber wall and said platter.

4. A device for vacuum metallizing a substrate in a station disposed at a port on a vacuum chamber, said device comprising:

a platter formed of metal and having an obverse side and a face side, said face side comprising a longitudinally-extending, substrate-receiving surface and being adapted to receive a substrate to be metallized;

a circumferentially-arranged metal ring disposed around said port and a circumferentially-arranged ring disposed on the perimeter of said platter, the ring around said platter corresponding to the dimensions of the ring around said port, said rings being adapted to mate with each other whereby to align said platter relative to said wall and compensate for variations in dimensions of components of said vacuum chamber;

means to resiliently engage said obverse side of said platter whereby to force said metal rings into contact with each other whereby to align said platter relative to said opening for metallization of said substrate.

5. The device according to claim 4 wherein said platter is resiliently disposed within a platter base and said resilient engagement means includes an articulated push rod extending from said platter base, said push rod being arranged to receive non-axial forces and translate said forces into axial forces to urge said platter base and said platter towards said wall in an axial direction.

6. The device according to claim 5 further including a stepped array of receiving rings on the obverse side of said platter base and a corresponding stepped array of surfaces on said push rod, said rings and surfaces having resilient rings disposed therebetween to allow for establishing positioning between the face side and the walls.

7. The device according to claim 5 wherein said platter has an obverse side and further including a collar extending from the center of said obverse side and a cavity disposed within the face side of said platter base, said collar being disposed within said cavity and further including a resilient junction between said recess and said collar whereby to hold said collar within said recess.

8. Apparatus for vacuum metallizing a substrate, said apparatus comprising:

a vacuum chamber, said vacuum chamber having at least one loading-unloading station and at least one sputtering station disposed on walls of said chamber, each of said stations being entered through ports;

at least two platter bases disposed within said vacuum chamber, each platter base being formed of a rigid material and having an obverse side and a face side, each platter base having a recess disposed on said face side to receive a platter;

a platter disposed within each of said recesses, each of said platters having an obverse side and a face side comprising a longitudinally-extending, substrate-receiving surface, each of said obverse sides being resiliently attached to a platter base;

a circumferentially-arranged ring disposed on the face side of each platter and another ring disposed around each of the ports, the rings on said face sides of each said platter being adapted to engage the rings around the ports whereby to align said platters and relative to said ports;

a push rod resiliently attached to each of said platter bases, each push rod being reciprocatable with a platter base whereby to force the perimeter of the platter base into sealing face-to-face contact with said ports;

means to rotate said platters on an axis of rotation whereby to index said platters from said loading-unloading station to said sputtering station and thence to a loading-unloading station;

a toggle shaft and a linkage extending between each toggle shaft and each push rod;

means to rotate said toggle shaft in one direction to move said platters normal to said axis of rotation and means to toggle said linkages whereby to force the perimeters of said platter bases against said walls and engage said walls with face-to-face sealing contact; and means to rotate said toggle shaft in the opposite direction to withdraw said platters from engagement with said walls for further rotation of said platters about said axis.

9. The apparatus according to claim 8 further including resilient means disposed between said push rod and the obverse side of its platter base.

10. The apparatus according to claim 8 wherein said platter has an obverse side and a collar extends from the center of said obverse side and a cavity is disposed within the face side of said platter base, said collar being disposed within said cavity and further including a resilient junction between said recess and said collar whereby to hold said collar within said cavity.

11. Apparatus for vacuum metallizing compact discs, said apparatus comprising:
- a vacuum chamber, said vacuum chamber having at least one loading-unloading station and at least one sputtering station disposed on walls of said chamber, each of said stations being entered through ports;
- at least two platter bases disposed within said vacuum chamber, each platter base being formed of a rigid material and having an obverse side and a face side, each platter base having a recess disposed in said face side to receive a platter;
- a platter disposed within each of said recesses, said platters each having an obverse side and a face side, said face sides each comprising longitudinally-extending, substrate-receiving surfaces, each of said obverse sides being resiliently attached to a platter base;
- a circumferentially-arranged ring disposed on the face side of each platter and another ring disposed around the ports, the rings on said face sides being adapted to engage the rings around the ports whereby to align said platters and relative to said ports;
- an articulated push rod extending from and resiliently attached to each of said platter bases, said push rod being arranged to receive non-axial forces and translate said forces into axial forces to urge said platter base and said platter towards said wall in an axial direction, each push rod being reciprocatable with a platter base whereby to force the perimeter of the platter base into sealing face-to-face contact with said ports;
- means to rotate said platters on an axis of rotation whereby to index said platters from said loading-unloading station to said sputtering station and thence to a loading-unloading station;
- a toggle shaft and a linkage extending between each toggle shaft and each push rod;
- means to rotate said toggle shaft in one direction to move said platters normal to said axis of rotation and means to toggle said linkages whereby to force the perimeters of said platter bases against said walls and engage said walls with face-to-face sealing contact; and
- means to rotate said toggle shaft in the opposite direction to withdraw said platters from engagement with said walls for further rotation of said platters about said axis.

12. A device for vacuum metallizing a substrate in a station disposed at a port on a vacuum chamber, said device comprising:
- a platter base formed of metal and having an obverse side and a face side, said face side having a perimeter portion, said face side further comprising a platter with a substrate-receiving surface portion, said substrate-receiving surface portion being adapted to receive a substrate to be metallized;
- an annular surface disposed around said port;
- means for said perimeter portion of said platter base to engage said annular surface;
- means to resiliently engage said obverse side of said platter base whereby to force said perimeter portion against said annular surface into contact with each other whereby to align said platter base relative to said port and compensate for variations in dimensions of components of vacuum chamber and further whereby to form a vacuum tight seal thus to metallize said substrate at said station.

13. The device according to claim 12 wherein said platter is resiliently disposed within said platter base and said resilient engagement means including an articulated push rod extending from said platter base, said push rod being articulated and arranged to receive non-axial forces and translate said forces into axial forces to urge said platter base and said platter towards said wall in an axial direction.

14. The device according to claim 13 further including a stepped array of receiving rings on the obverse side of said platter base and a corresponding stepped array of surfaces on said push rod, said rings and surfaces having resilient rings disposed therebetween to allow for establishing positioning between the face side and the walls.

15. The device according to claim 12 wherein said platter has an obverse side and further including a collar extending from the center of said obverse side and a cavity disposed within the face side of said platter base, said collar being disposed within said cavity and further including a resilient junction between said recess and said collar whereby to hold said collar within said recess.

* * * * *